United States Patent
Liao

(10) Patent No.: US 6,534,402 B1
(45) Date of Patent: Mar. 18, 2003

(54) METHOD OF FABRICATING SELF-ALIGNED SILICIDE

(75) Inventor: Wen-Shiang Liao, Miaoli Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/025,430

(22) Filed: Dec. 19, 2001

(30) Foreign Application Priority Data

Nov. 1, 2001 (TW) ..................... 090127126 A

(51) Int. Cl.[7] .............................................. H01L 21/44
(52) U.S. Cl. .................. 438/659; 438/664; 438/683
(58) Field of Search .............................. 438/301, 303, 438/586, 592, 659, 664, 682, 683

(56) References Cited

U.S. PATENT DOCUMENTS

| | | | | |
|---|---|---|---|---|
| 5,122,479 A | * | 6/1992 | Audet et al. ............... | 438/659 |
| 5,677,213 A | * | 10/1997 | Lee ............................. | 438/305 |
| 5,918,141 A | * | 6/1999 | Merrill ....................... | 439/583 |
| 6,090,692 A | * | 7/2000 | Song .......................... | 438/592 |
| 6,274,511 B1 | * | 8/2001 | Wieczorek et al. ......... | 438/766 |
| 6,294,434 B1 | * | 9/2001 | Tseng ......................... | 438/303 |
| 6,329,287 B1 | * | 12/2001 | Gadepally .................. | 438/674 |

* cited by examiner

*Primary Examiner*—T. N. Quach
(74) *Attorney, Agent, or Firm*—J. C. Patents

(57) ABSTRACT

A method of fabricating a self-aligned silicide (salicide). A gate and a source/drain region are formed in the substrate. An ion implantation process is performed to dope surfaces of the gate and the source/drain region with metal ions. A thermal process is performed to have the metal ions react with silicon in surfaces of the gate and the source/drain region, so as to form silicide layers on the gate and the source/drain region. The metal ions include cobalt ions, titanium ions, nickel ions, platinum ions and palladium ions.

12 Claims, 5 Drawing Sheets

METHOD OF FABRICATING SELF-ALIGNED SILICIDE

CROSS-REFERENCE TO RELATED APPLICATION

This application claims the priority benefit of Taiwan application serial no. 90127126, filed Nov. 1, 2001.

BACKGROUND OF THE INVENTION

1. Field of the Invention

The invention relates in general to a method of fabricating a metal oxide semiconductor (MOS) transistor, and more particularly, to a method of fabricating a self-aligned silicide (salicide).

2. Description of the Related Art

Along with the increase of integration of semiconductor devices, the pattern dimension and linewidth of devices are gradually shrinking. Consequently, the contact resistance of the gates and the conductive lines in the devices are increased to result in a longer RC delay, which affects the operation speed of the devices. Silicide having a resistance lower than that of polysilicon and a thermal stability better than the normal interconnection material (such as aluminum) has been used to reduce the sheet resistance of the source/drain region. In addition, the completeness of the shallow junction between metal and conductive device can be ensured by forming the silicide at the junction between the gate, the source/drain region and the metal interconnect, so that the resistance therebetween is reduced.

Currently, self-aligned silicide is widely applied in semiconductor fabrication process. In the fabrication process of self-aligned silicide, a metal layer is formed on a semiconductor wafer. The wafer is then disposed in a high temperature environment. The metal layer then reacts with silicon of the gate and the source/drain region of the semiconductor wafer to form a silicide layer. Under the high temperature, a phase transition is caused to result in a lower resistance of the silicide. The metal layer on other portions of the wafer does not have a direct contact with silicide, so that no silicide layer is formed thereon. Therefore, the fabrication process of silicide does not require a photolithography process for alignment. The silicide formed by such fabrication process is thus called self-aligned silicide (salicide).

FIGS. 1A–1D show cross sectional views of a conventional fabrication process for forming salicide.

Referring to FIG. 1, a substrate 100 on which an isolation structure 102, a gate dielectric layer 104, a gate conductor 106, a source/drain region 108 and a spacer 110 are formed is provided. A metal layer 112 is formed on the substrate 100 using physical vapor deposition (PVD) or sputtering.

Referring to FIG. 1B, a rapid thermal annealing (RTA) process is performed at a temperature between 450° C. and 600° C. The metal layer 112 is then reacted with silicon of the gate conductor 106 and the source/drain region 108 to form a silicide layer 114.

Referring to FIG. 1C, a wet etching process is performed. A solution of a mixture of hydrochloride and hydroxide or a mixture of sulfuric acid and hydroxide is used to remove the remaining metal layer 112 that has not reacted with silicon. As a result, only the silicide layer 114 on surfaces of the gate conductor 106 and the source/drain region 108 remains.

Referring to FIG. 1D, a second rapid thermal annealing process is performed at a temperature of 600° C. to 850° C. The silicide layer 114 is transformed into a silicide layer 116 with low resistance.

In the above salicide process, the most common materials used in the industry currently include titanium, cobalt, and nickel. For example, cobalt silicide has a compound CoSi with a high resistance phase and a compound $CoSi_2$ with a low resistance phase. The formation of the high resistance phase requires a low temperature. Therefore, the first rapid thermal processes is performed for forming the cobalt silicide with the high resistance phase, and the second rapid thermal process is performed to transform the high resistance phase of the cobalt silicide into the low resistance phase. However, having a certain solid solubility under a certain temperature, silicon diffuses into the metal layer and the metal refills the vacancy left by the silicon diffusing into the metal layer to cause a spiking effect. Therefore, when performing the first rapid thermal process for forming CoSi, the junction between CoSi and silicon is uneven (as shown in FIGS. 1B and 1C), and the thickness of CoSi is non-uniform. When performing the second rapid thermal annealing process to transform the high resistance phase into the low resistance phase, the junction between $CoSi_2$ and silicon is more uneven, so that the spike effect is more obvious (as shown in FIG. 1D). The low resistance $CoSi_2$ extends further into the junction of source/drain region, or even extends through the junction to cause serious junction leakage. The device performance is thus affected.

SUMMARY OF THE INVENTION

The present invention provides a method of fabricating a self-aligned silicide layer to prevent the silicide from extending through a junction of a source/drain region to cause the junction leakage.

It is another object of the present invention to provide a method of fabricating a self-aligned silicide applicable to a MOS transistor with an ultra-shallow junction.

In the method of fabricating a self-aligned silicide layer in accordance of the present invention, a substrate having a gate and a source/drain region is provided. An ion implantation step is performed to the substrate, so that surfaces of the gate and the source/drain region are doped with metal ions. A first rapid thermal annealing step is performed to form a silicide layer on the surfaces of the gate and the source/drain region. A second rapid thermal annealing step is performed to transform a high resistance phase of the silicide layer into a low resistance phase.

In the present invention, metal ions are implanted into the silicon substrate, followed by two steps of rapid thermal annealing to fabricate a thin, long, uniform and highly conductive silicide layer. The present invention does not require the performance of sputtering or physical vapor deposition. Therefore, the step of removing the remaining metal layer is saved. The first rapid thermal annealing step and the second rapid thermal annealing step can be performed in the same machine, so that the fabrication cost is also reduced.

The implantation energy and implantation depth into the substrate (that is, the depth of the amorphous silicon) of implantation of metal ions can be precisely controlled. The present invention is thus applicable to MOS transistor with an ultra shallow junction.

In addition, the dosage of the implanted metal ions is also controllable up to $10^{16}$ ions/$cm^2$, so that a silicide layer with a better conductivity can be obtained.

While implanting the metal ions, surfaces of the gate and source/drain regions bombarded thereby are transformed into amorphous silicon regions. The interface between such amorphous silicon regions and silicon substrate is very smooth, so that the silicide layer formed subsequently is also very smooth with a uniform thickness. The spiking effect is thus very unlike to occur, and the junction leakage problem of the source/drain region is resolved.

Moreover, damage of amorphous silicon caused by ion implantation can also be mended during the rapid thermal process for transforming the crystal phase of the silicide. The formation of bird's beak of the field oxide isolation structure is thus prevented.

Both the foregoing general description and the following detailed description are exemplary and explanatory only and are not restrictive of the invention, as claimed.

DESCRIPTION OF THE PREFERRED EMBODIMENTS

In the present invention, an ion implantation step of metal ions and two rapid thermal processes are performed to form a thin, long, uniform and high conductivity silicide. The spiking effect is prevented, so that the junction leakage caused thereby is also prevented.

Figure 1A:
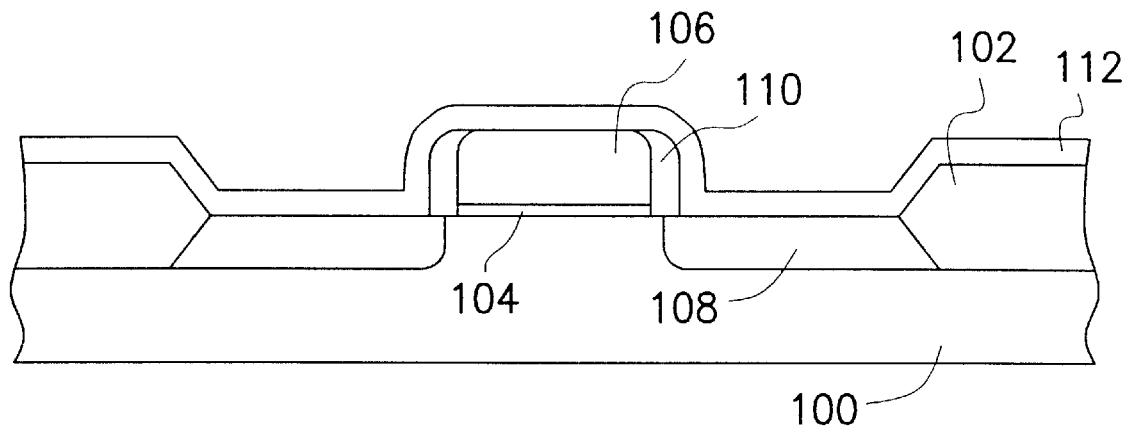
FIGS. 1A to 1D are schematic cross-sectional views showing a conventional fabrication process forming self-aligned silicide.
Figure 1B:
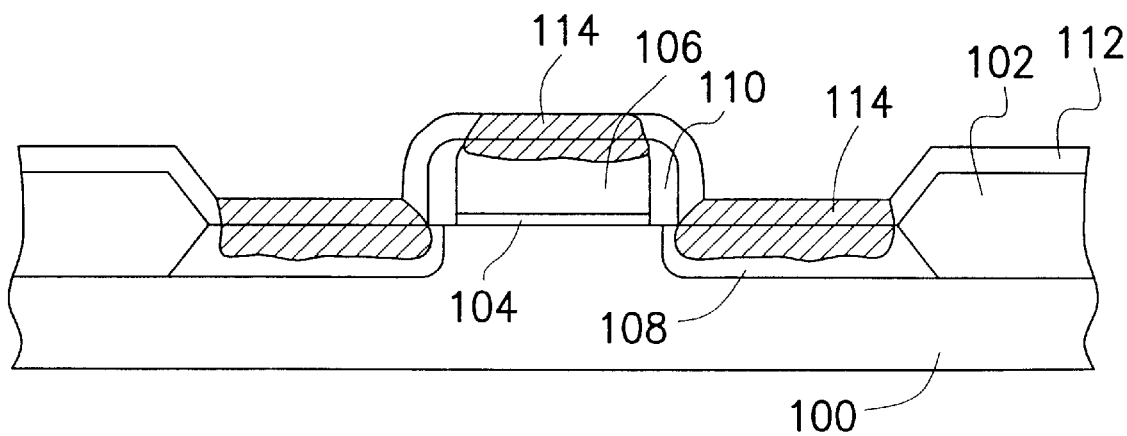
Figure 1C:
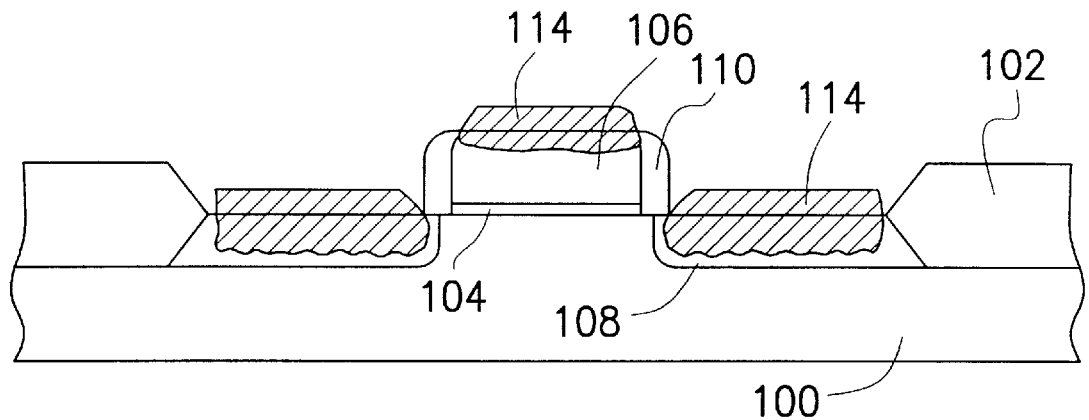
Figure 1D:
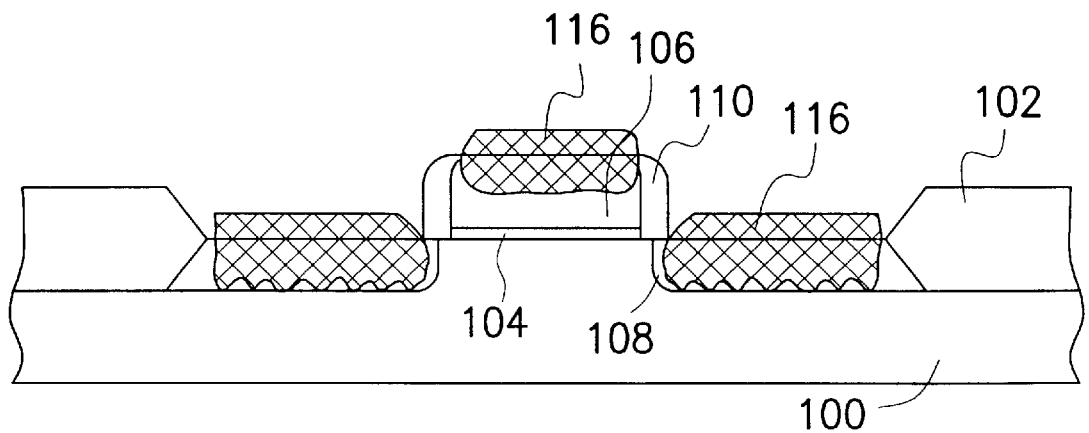
Figure 2A:
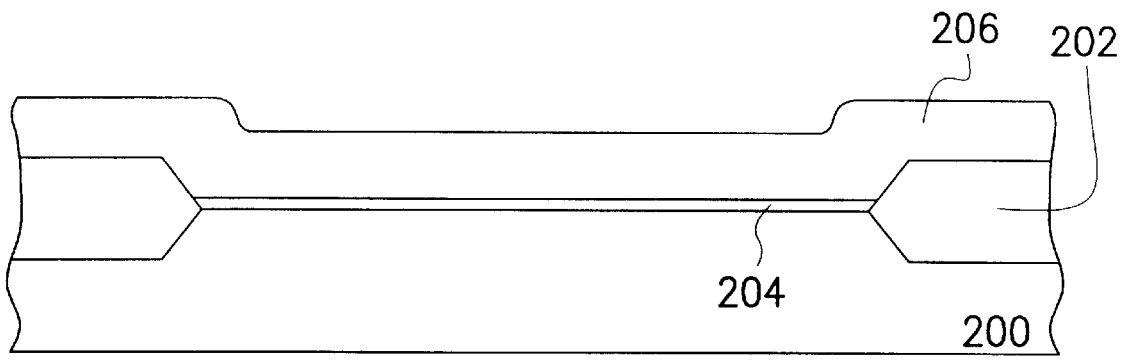
FIGS. 2A to 2F are schematic cross-sectional views showing a fabrication process for forming self-aligned silicide in one embodiment of the invention.

Referring to FIG. 2A, a substrate 200 such as a silicon substrate is provided. An isolation structure 202 is formed on the substrate 200. The method for forming the isolation structure 202 includes shallow trench isolation (STI) or local oxidation (LOCOS), for example.

A gate dielectric layer 204 and a gate conductor 206 are sequentially formed on the substrate 200. The gate dielectric layer 204 includes a silicon oxide layer formed by thermal oxidation, for example. The material of the gate conductor 206 includes doped polysilicon, for example. The method for forming the doped polysilicon includes applying an in-situ doping method in a chemical vapor deposition (CVD) process, for example.

Figure 2B:
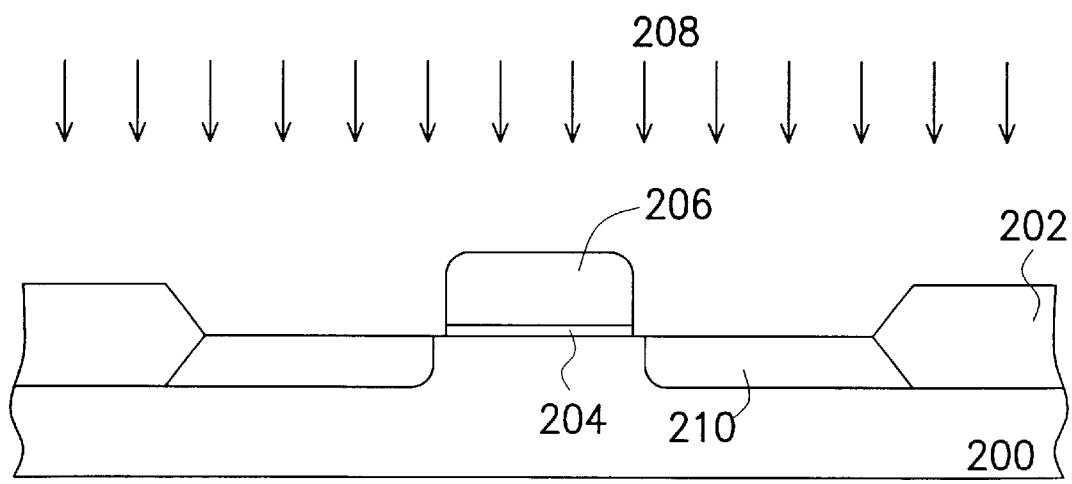

Referring to FIG. 2B, the gate conductor 206 and the gate dielectric layer 204 are patterned using a photolithography and etching process to form a gate structure.

An ion implantation 208 is performed with the gate structure as a mask, so that a source/drain region 210 is formed in the substrate 200.

Figure 2C:
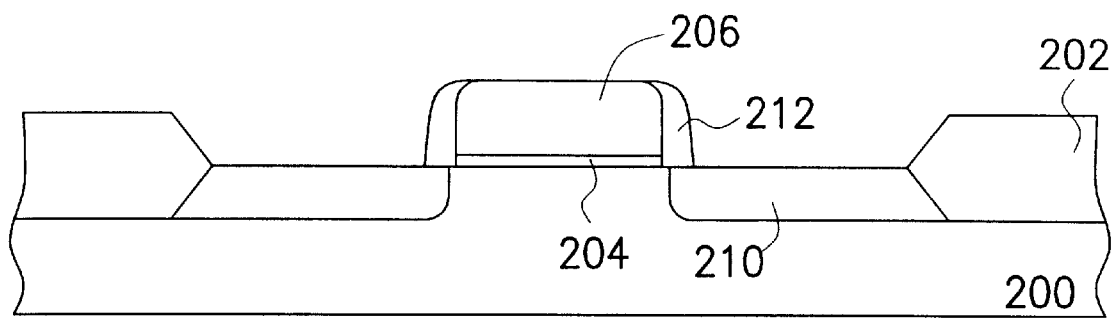

Referring to FIG. 2C, a spacer 212 is formed on a sidewall of the gate structure. The material of the spacer 212 includes silicon oxide or silicon nitride, for example. The method for forming the spacer 212 includes forming a conformal dielectric layer (not shown) on the substrate 200. A part of the dielectric layer is then removed to leave the spacer 212 only on the sidewall of the gate structure. The method to remove a part of the dielectric layer includes anisotropic etching such as reactive ion etching.

Figure 2D:
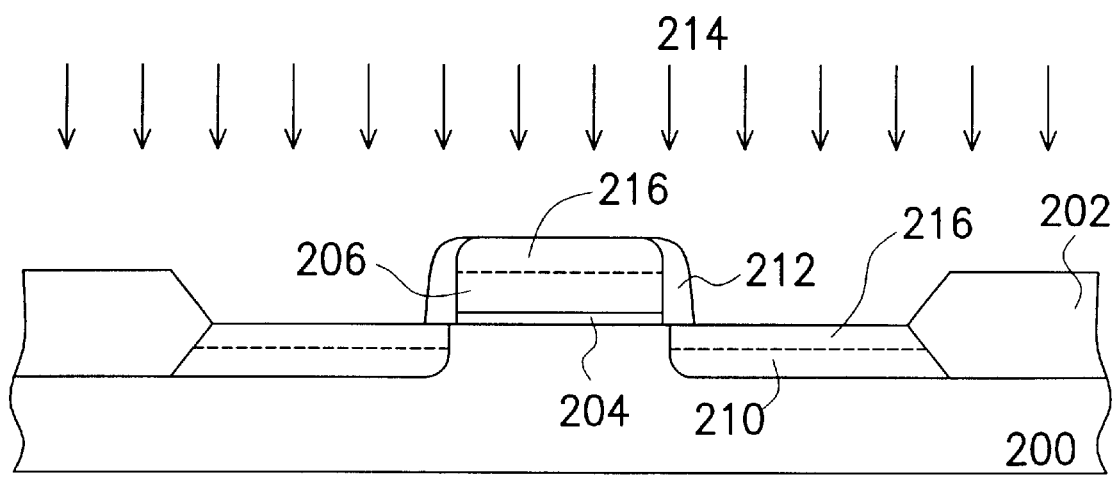

Referring to FIG. 2D, an ion implantation process 214 is performed to implant metal ions into surfaces of the gate conductor 206 and the source/drain regions 210. The surfaces of the gate conductor 206 and source/drain regions 210 are thus transformed into amorphous silicon regions. The metal ions include cobalt ions, the implantation depth of the metal ions (that is, the thickness of the amorphous silicon layer) is about 300 angstroms to about 500 angstroms, and the implantation dosage reaches about $10^{16}$ ions/cm$^2$.

The surfaces of the gate conductor 206 and the source/drain region 210 implanted with the cobalt ions are transformed into amorphous silicon regions 216. The amorphous silicon regions 216 provide a smooth interface to the source/drain region 210, so that the spiking effect caused during the subsequent process for forming the silicide layer is prevented. Further, the silicide layer is not formed very deep in the source/drain region 210, so that the junction leakage is prevented.

Figure 2E:
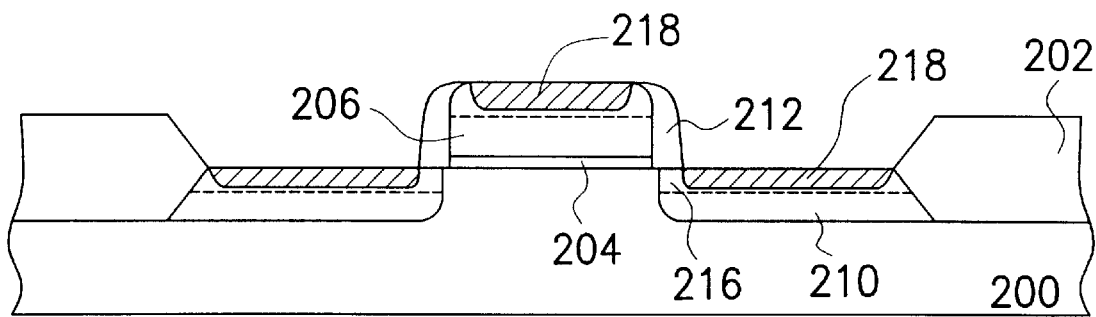
Figure 2F:
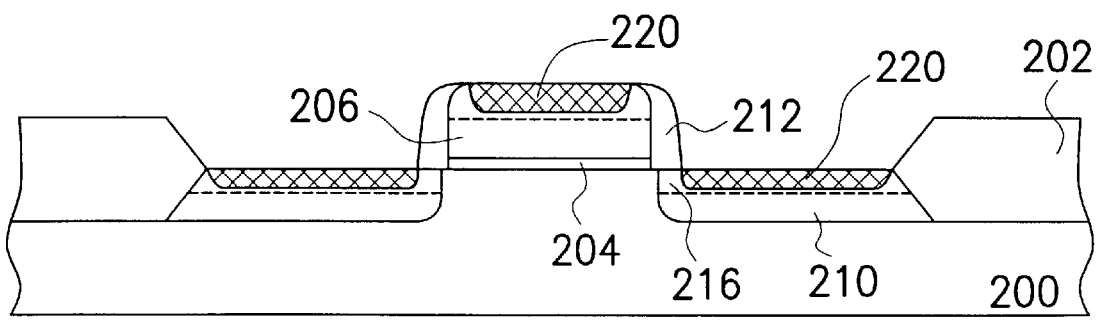

Referring to FIG. 2E, a first rapid thermal annealing process is performed at a temperature of about 450° C. to about 600° C. The cobalt ions in the amorphous silicon regions 216 react with silicon to form a high resistance cobalt silicide layer (CoSi) 218. As the interface between the silicide layer 218 and the source/drain region 210 is smooth, the thickness of the silicide layer 218 can be adjusted by controlling the thickness of the amorphous regions 216. Referring to FIG. 2F, a second rapid thermal annealing process is performed at a temperature of 600° C. to 850° C. The high-resistivity cobalt monosilicide (CoSi) layer 218 is transferred into a low-resistivity CoSi$_2$ and a silicide layer 220 is formed therefrom. As the interface between the silicide layer 220 and the source/drain region 210 is smooth, and the silicide layer 220 is transferred from the silicide layer 218, the interface between the silicide layer 220 and the source/drain region 210 is also smooth and the spiking effect is prevented from the process. Further, the thickness of the silicide layer 220 can be adjusted by controlling the thickness of the amorphous regions 216.

According to the above embodiment, the metal ions are implanted into the silicon substrate, and two rapid thermal processes are applied to fabricate a thin, long, uniform and highly conductively silicide layer.

As the metal layer is not formed by sputtering or physical vapor deposition on the entire surface of the substrate, the step of removing the unreacted metal layer is not required. Consequently, one does not have to remove the substrate from a machine. The first and second rapid thermal annealing processes can be performed in the same machine to reduce the fabrication cost.

In addition, the present invention uses ion implantation to implant the metal ions, so that the implantation energy and implantation depth of the metal ions (that is, the thickness of the amorphous silicon region) can be precisely controlled. Therefore, the present invention is applicable to the MOS transistor with an ultra-shallow junction.

In addition, the dosage of the metal ions can be controlled as required. The conductivity of the silicide layer can thus be controlled. The dosage of the metal ions can reach to about $10^{16}$ ions/cm$^2$.

Further, being impacted by the metal ions, the surfaces of the gate conductor and source/drain region are transformed into amorphous silicon regions. The amorphous silicon region provides a smooth interface to the silicon substrate, so that the interface between the silicide formed subsequently and the silicon substrate is smooth, too. The thickness and uniformity of the silicide layer can thus be effectively controlled. The spiking effect is prevented, and since the silicide layer does not extend too deep in the source/drain region, the junction leakage is also prevented.

Moreover, damage of amorphous silicon caused by ion implantation can also be mended during the rapid thermal process for transforming the crystal phase of the silicide. The formation of bird's beak of the field oxide isolation structure is thus prevented.

The above embodiment of the present invention uses cobalt ions for forming the silicide. It is appreciated that other refractory metal ions such as titanium ions, nickel ions, platinum ions and palladium ions are also applicable for forming the silicide layer.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a self-aligned silicide layer, applicable to a metal oxide semiconductor device with an ultra-shallow junction, the method comprising:

providing a substrate, on which a gate dielectric layer, a gate conductor, a spacer and a source/drain region are formed;

performing an ion implantation process to implant a metal ion into surfaces of the gate conductor and the source/drain region, wherein the surfaces are transformed into amorphous silicon regions with a thickness of about 300 angstroms to about 500 angstroms;

performing a first rapid thermal process, so that the metal ion in the gate conductor and the source/drain region reacts with silicon in the amorphous silicon regions to form a first silicide layer; and performing a second rapid thermal process, causing the first silicide layer to transform into a second silicide layer with a resistance lower than that of the first silicide layer.

2. The method according to claim 1, wherein the ion implantation includes implanting a metal refractory ion into the surfaces of the gate conductor and the source/drain region.

3. The method according to claim 1, wherein the ion implantation includes implanting cobalt ions into the surfaces of the gate conductor and the source/drain region.

4. The method according to claim 1, wherein the first rapid thermal annealing process is performed at a temperature of about 450° C. to about 600° C.

5. The method according to claim 1, wherein the first silicide layer includes CoSi.

6. The method according to claim 1, wherein the second rapid thermal annealing process is performed at a temperature of about 600° C. to about 850° C.

7. The method according to claim 1, wherein the second silicide layer includes $CoSi_2$.

8. The method according to claim 1, wherein the ion implantation includes implanting titanium ions into the surfaces of the gate conductor and the source/drain region.

9. The method according to claim 1, wherein ion implantation includes implanting nickel ions into the surfaces of the gate conductor and the source/drain region.

10. The method according to claim 1, wherein ion implantation includes implanting platinum ions into the surfaces of the gate conductor and the source/drain region.

11. The method according to claim 1, wherein ion implantation includes implanting palladium ions into the surfaces of the gate conductor and the source/drain region.

12. The method according to claim 1, wherein ion implantation includes implanting the metal into the surfaces of the gate conductor and the source/drain region with a dosage of about $10^{16}$ ions/cm$^2$.

* * * * *